United States Patent [19]

Ogita

[11] 4,228,546
[45] Oct. 14, 1980

[54] AM RADIO RECEIVER

[75] Inventor: Minoru Ogita, Hamamatsu, Japan

[73] Assignee: Nippon Gakki Seizo Kabushiki Kaisha, Shizuoka, Japan

[21] Appl. No.: 880,688

[22] Filed: Feb. 23, 1978

[30] Foreign Application Priority Data

Mar. 4, 1977 [JP] Japan .................................. 52-23351

[51] Int. Cl.² .......................... H04B 1/10; H04B 1/26
[52] U.S. Cl. .................................... 455/302; 455/337; 329/50
[58] Field of Search ................... 325/49, 50, 329, 330, 325/408, 409, 419, 437, 487; 329/50, 122; 331/109, 183

[56] References Cited

U.S. PATENT DOCUMENTS

| | | | |
|---|---|---|---|
| 2,193,801 | 3/1940 | Byrne | 325/329 |
| 2,605,397 | 7/1952 | Cheek | 325/329 |
| 2,979,611 | 4/1961 | Halina | 325/329 |
| 3,329,899 | 7/1967 | Holder | 325/329 |
| 3,430,151 | 2/1969 | Badessa | 325/329 |
| 3,500,246 | 3/1970 | Werner | 331/183 |
| 3,628,155 | 12/1971 | Muzzi | 325/329 |

Primary Examiner—Robert L. Griffin
Assistant Examiner—Jin F. Ng
Attorney, Agent, or Firm—Jordan and Hamburg

[57] ABSTRACT

In an AM receiver, an intermediate frequency amplifier stage is excluded, but a harmonic oscillation circuit is provided for producing a signal synchronous with an amplitude-modulated signal applied thereto, so that the output of the harmonic oscillation circuit is utilized for the AM demodulation of the received signal, whereby image-frequency components as in the superheterodyne system are not detected and only the tuned-frequency component is detected, thus preventing the occurrence of radio interference.

6 Claims, 4 Drawing Figures

AM RADIO RECEIVER

BACKGROUND OF THE INVENTION

This invention relates to AM radio receivers which receive an amplitude modulated signal to provide an audio signal.

A conventional AM receiver extensively employs a superheterodyne system such as shown in FIG. 1. Referring to FIG. 1, an amplitude-modulated signal (of a frequency fs) received by an antenna 1 is amplified by a high-frequency amplifier 2, and the signal thus amplified is applied to a frequency converter 3 where it is converted into a signal having a difference frequency between the frequency fs and the oscillation frequency fl of a local oscillator 4 (or an intermediate frequency fi=fl−fs, or fs−fl). Then, the signal is amplified by an intermediate-frequency amplifier 5, and the signal thus amplified is detected by a demodulator 6 to provide an audio signal.

The conventional superheterodyne system suffers from the following drawbacks: In the case where, for instance, the local oscillation frequency fl is set to be lower than the received signal frequency fs, only a signal having a frequency higher by the intermediate frequency fi than the local-oscillation frequency fl should be received. However, a signal having a frequency lower by the intermediate frequency fi than the local oscillation frequency fl is also converted into the intermediate frequency fi if this signal is sufficiently strong, as a result of which a so-called image-frequency interference occurs; that is, the occurrence of radio interference cannot be avoided.

Furthermore, a high selectivity is required for the intermediate-frequency amplifier stage. However it is also desirable not to make the selected bandwidth too narrow, otherwise the fidelity of a signal transmission in the selected bandwidth is degraded. Therefore, it is necessary to provide an intermediate-frequency filter comprising a special collective band-pass filter, a crystal filter, or a mechanical filter, which leads an increment in the manufacturing cost.

SUMMARY OF THE INVENTION

Accordingly, an object of this invention is to eliminate the above-described difficulties accompanying a conventional AM receiver.

More specifically, an object of the invention is to provide an AM receiver in which no image-frequency interference occurs and accordingly the occurrence of radio interference is prevented.

Another object of the invention is to provide an AM receiver the circuitry of which is simplified by eliminating the necessity of providing an intermediate frequency filter.

A further object of the invention is to provide an AM receiver in which a tuned frequency can be readily read.

The foregoing objects and other objects of the invention have been achieved by the provision of an AM receiver comprising a harmonic oscillation circuit for outputting a signal synchronous with an amplitude-modulated signal applied to the receiver, and means for obtaining the demodulation output of the amplitude-modulated signal by the use of the output signal of the harmonic oscillation circuit.

It is preferable to provide a synchronization detection circuit operating to synchronously detect the amplitude-modulated signal with the aid of the output signal of the harmonic oscillation circuit, in order to prevent the occurrence of radio interference.

Furthermore, it is desirable to provide an amplitude control circuit adapted to maintain the output signal of the harmonic oscillation circuit constant, and to obtain a demodulated signal from the amplitude control circuit, in order to simplify the circuitry.

In addition, supplying the output signal of the harmonic oscillation circuit to a frequency counter contributes to facility of the operation of the AM receiver.

The nature, principle and utility of the invention will become more apparent from the following detailed description and the appended claims when read in conjunction with the accompanying drawings, in which like parts are designated by like reference numerals or characters.

DETAILED DESCRIPTION OF THE INVENTION

Figure 1:
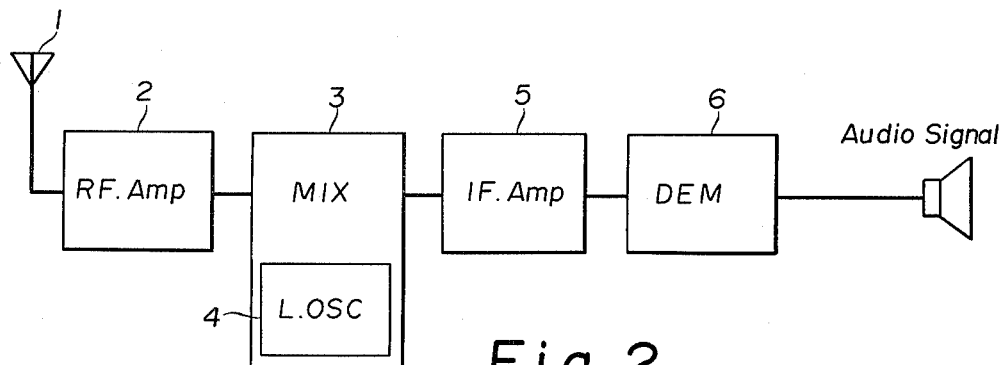
FIG. 1 is a block diagram illustrating a conventional superheterodyne receiver.
Figure 2:
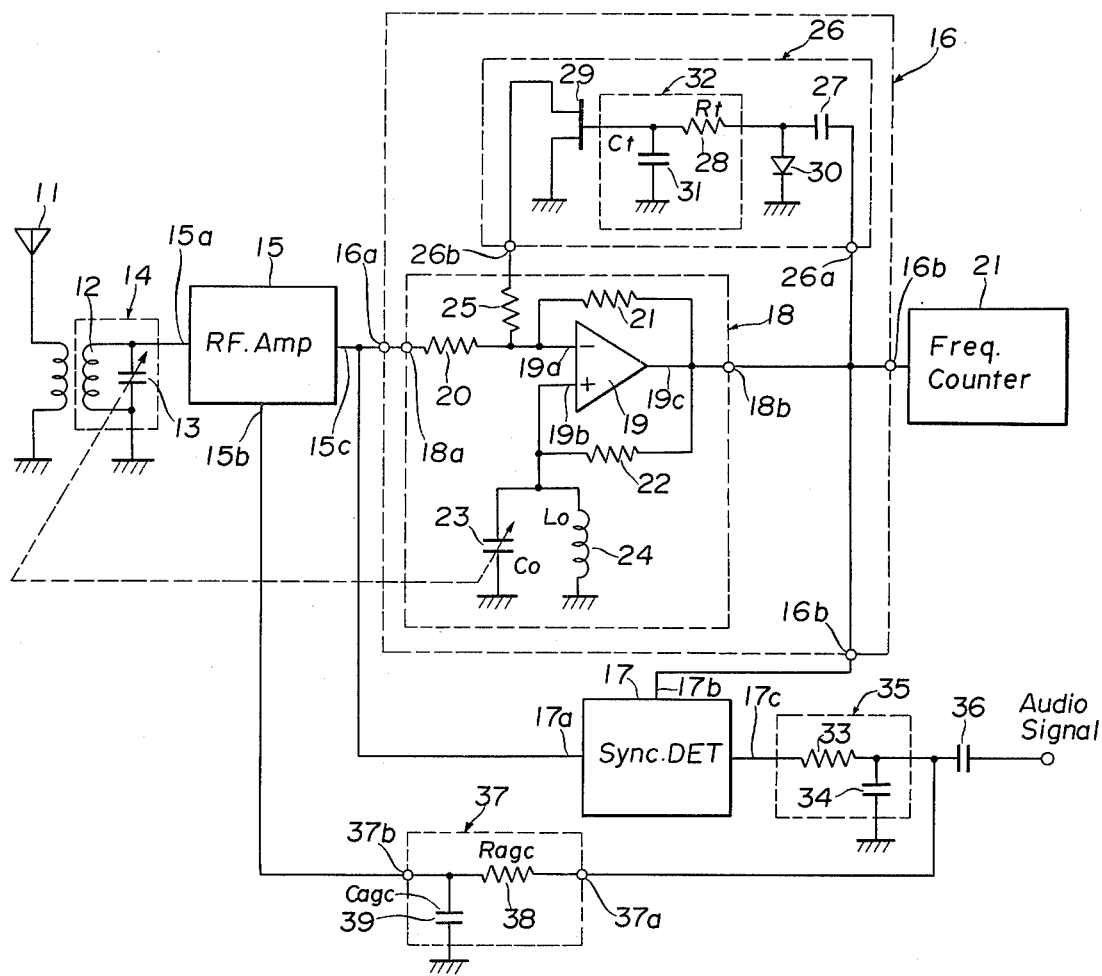
FIG. 2 is a schematic circuit diagram illustrating a first embodiment of this invention.

One preferred embodiment of this invention is shown in FIG. 2, in which an antenna 11 is connected to a first input 15a of a high-frequency amplifier 15 through an antenna input circuit 14 which is a parallel circuit made up of a coil 12 and a variable capacitor 13, and the output 15c of the high-frequency amplifier 15 is connected to the input terminal 16a of a harmonic oscillation circuit 16 which outputs a sinusoidal wave signal and to a first input 17a of a synchronization detection circuit 17.

The harmonic oscillation circuit 16 comprises an input terminal 18a connected to the input terminal 16a of the circuit 16, an oscillation section 18 and an amplitude control section 26. The oscillation section 18 comprises: an operational amplifier 19 having an inverting input 19a and a non-inverting input 19b; an input resistor 20 connected between the input terminal 18a and the inverting input 19a of the operational amplifier 19; a negative feedback resistor 21 connected between the inverting input 19a and the output 19c of the operational amplifier 19; a positive feedback resistor 22 connected between the output 19c and the non-inverting input 19b of the operational amplifier 19; a parallel circuit made up of a variable capacitor 23 and a coil 24 for setting an oscillation frequency $f_0$, the parallel circuit being connected between the non-inverting input 19b of the operational amplifier 19 and the ground, and a resistor 25 connected between the non-inverting input 19a of the operational amplifier 19 and the output terminal 26b of the amplitude control section 26. The variable capacitor 23 is interlocked with the variable capacitor 13 adapted to determine the tuning frequency of the high-frequency amplifier 15, so that a signal which is equal in both frequency and phase to the amplitude-modulated signal received through the antenna input circuit 14 is outputted by the harmonic oscillation circuit 16. Thus, the output of the circuit 16 is synchronized with the received amplitude-modulated signal.

An input terminal 26a of the amplitude control circuit 26 is connected to the output terminal 18b of the oscillation section 18 which operates to maintain the amplitude of the signal outputted by the harmonic oscillation circuit 16 constant. The amplitude control circuit 26 comprises: a coupling capacitor 27, a resistor 28 connected in series to the coupling capacitor 27, a field effect transistor 29 the gate of which is connected to the resistor 28, a diode 30 connected between the connection point of the capacitor 27 and the resistor 28 and the ground, and a capacitor 31 connected between the connection point of the resistor and the gate of the field effect transistor 29 and the ground.

The resistor 28 and the capacitor 31 form an integration circuit 32, and their values are selected so as to satisfy the following condition:

$$fmh \leq \frac{1}{2\pi \cdot Ct \cdot Rt} < fc$$

where Rt is the resistance of the resistor 28, Ct is the capacitance of the capacitor 31, fc is the carrier wave frequency of the received amplitude-modulated signal, and fmh is the maximum frequency of the modulating signal of the amplitude-modulated signal. On this condition, the control by the circuit 26 is achieved in response to the average strength of the modulated signal instead of the strength of the carrier wave. The output signal of the integration circuit 32 is employed as a control signal for the amount of negative feedback, which is applied to the non-inverting input 19a of the operational amplifier 19 in the oscillation section 18 through both the field effect transistor 29 and the resistor 25.

Figure 3:
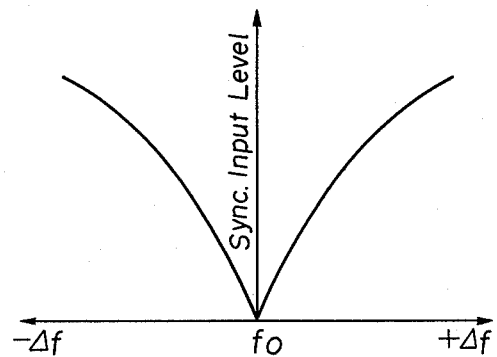
FIG. 3 is a graphical representation indicating the input frequency response of a harmonic oscillation circuit employed in an AM receiver according to this invention.

The oscillation frequency $f_0$ of the harmonic oscillation circuit 16 is determined by the value $C_0$ of the variable capacitor 23 and the inductance value $L_0$ of the coil 24. The relationship between the input signal level of the harmonic oscillation circuit 16 and the frequency of its output signal synchronizing with the input signal is indicated in a graphical representation shown in FIG. 3, in which Δf on the horizontal axis indicates the difference between the input signal frequency f and the oscillation frequency $f_0$. As is apparent from FIG. 3, a considerably high input level is required for outputting a signal having the same frequency as the frequency of an input signal which is different (or remote on the horizontal axis) from the oscillation frequency $f_0$. Accordingly frequency components other than the oscillation frequency $f_0$ determined by the variable capacitor 23 and the coil 24 are eliminated.

The output terminal 16b of the harmonic oscillation circuit 16 is connected to a frequency counter which operates to indicate the frequency of the output signal of the harmonic oscillation circuit 16 and to a second input 17b of the synchronization detection circuit 17. This synchronization detection circuit 17 operates to synchronously detect the amplitude-modulated signal which is amplified by the high-frequency amplifier 15. The output 17c of the synchronization detection circuit 17 is connected to a low-frequency amplifier stage through a low-pass filter 35 made up of a resistor 33 and a capacitor 34 and through a DC component removing capacitor 36.

The connection point of the low-pass filter 35 and the capacitor 36 is connected to the input terminal 37a of an automatic gain control (AGC) circuit 37, the output terminal 37b of which is connected to the second input 15b of the high-frequency amplifier 15. The AGC circuit 37 comprises an integration circuit formed with a resistor 38 and a capacitor 39. In this connection, if the resistance of the resistor 38, the capacitance of the capacitor 39, and the minimum frequency of the modulating signal are expressed by Ragc, Cagc and fml, respectively, then it is preferable that the following condition is established:

$$fml >> \frac{1}{2\pi \cdot Cagc \cdot Ragc}$$

because it is desirable that the automatic gain control is carried out in response to the average strength of the carrier wave (corresponding to the sum of the DC component and the audio signal component outputted by the low-pass filter 35) and accordingly it is desirable that the integration circuit has a relatively large time constant.

In operation, when the tuning frequency of the antenna input circuit 14 is set to a desired frequency by adjusting the capacitance of the variable capacitor 13 with an operating knob (not shown), an amplitude-modulated signal is applied through the antenna 11 and the circuit 14 to the high-frequency amplifier 15, where it is amplified. The amplitude-modulated signal thus amplified is applied to the harmonic oscillation circuit 16. The harmonic oscillation circuit 16 has the frequency $f_0$ (equal to the tuning frequency) set by the coil 24 and the variable capacitor 23 interlocked with the variable capacitor 13, and outputs a signal in phase with the amplitude-modulated signal. In this case, if the signal level of the oscillation output of the harmonic oscillation circuit 16 is low, then the terminal voltage of the diode 30 is also low. Accordingly, the gate voltage applied to the field effect transistor 29 through the integration circuit 32 is low, and the amount of feedback applied to the inversion input 19a of the operational amplifier 19 through the resistor 25 is small. As a result, the level of a synchronization signal outputted by the harmonic oscillation circuit 16 is not lowered, and is maintained at a predetermined value. In contrast, when the signal level of the oscillation output of the harmonic oscillation circuit 16 is high, the terminal voltage of the diode 30 is also high. Accordingly, the gate voltage applied to the field effect transistor 29 through the integration circuit 32 is increased, and the amount of feedback applied to the inversion input 19a of the operational amplifier 19 through the resistor 25 is increased. As a result, the level of the synchronization signal outputted by the harmonic oscillation circuit 16 is not increased, and is maintained at the predetermined value.

The shychronization detection circuit 17 operates to receive the signal (for instance, $2E_0 \cos(\omega_0 t + \theta')$ where $2E_0$ is the amplitude, $\omega_0 = 2\pi f_0$, and $\theta'$ is the phase angle) outputted by the harmonic oscillation circuit 16, and synchronously detect with the aid of this signal the output signal (for instance, $Ec \cdot an \cos(\omega_c t + \theta)$, where Ec is the amplitude of the carrier wave, an is the modulating signal, $\omega_c$ is the carrier wave angular frequency, and $\theta$ is the phase angle) of the high-frequency amplifier 15. The output of the synchronization detection circuit 17 can be represented by the following equation, because $\omega_c = \omega_o$ in this synchronization detection:

$$E_c \cdot an \cdot \cos(\omega_c t + \theta) 2E_O \cdot \cos(\omega_o t + \theta') = E_c \cdot E_O \cdot an\{-\cos(\theta - \theta') + \cos(2\omega_c t + \theta + \theta')\}$$

If the frequency component twice as high as the carrier frequency is removed by means of the low-pass filter 35, the following component only can be obtained:

$$E_c \cdot E_O \cdot an \cdot \cos(\theta - \theta')$$

As $\theta = \theta'$ in this synchronization detection, the output of the low-pass filter 35 is as follows:

$$E_c \cdot E_O \cdot an$$

Thus, only the signal proportional to the modulating signal can be obtained. That is, only the modulating signal component contained in the tuned frequency can be obtained, and therefore no image-frequency interference occurs, and the occurrence of radio interference can be prevented. The obtained modulating signal (or the audio signal) is applied through the capacitor 36 to the low-frequency amplifier stage, and is produced through a loudspeaker (not shown) or the like.

The signal outputted by the harmonic oscillation circuit 16 is applied to the frequency counter 21, where the frequency is indicated by an indicator section (not shown). The provision of the frequency counter 21 is convenient for immediately reading the received frequency.

Figure 4:
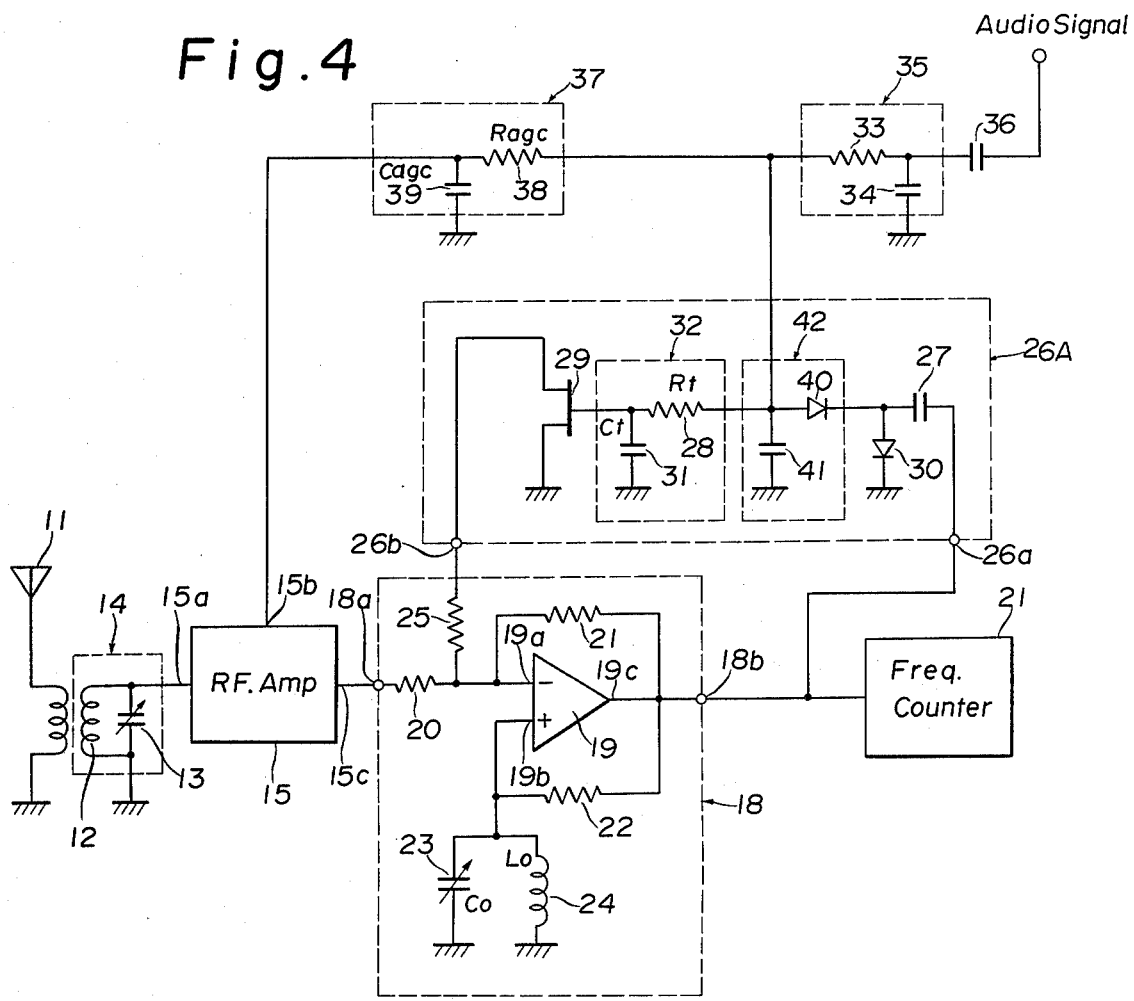
FIG. 4 is a schematic circuit diagram illustrating a second embodiment of the invention.

Shown in FIG. 4 is another embodiment of this invention, in which no synchronization detection circuit 17 is provided, but the signal for controlling the amplitude control circuit 26 in the harmonic oscillation circuit 16 is utilized to obtain the demodulated signal through the envelope detection. Those component elements which have been previously described with reference to FIG. 2 are similarly numbered. An amplitude control circuit 26a in FIG. 4 is obtained by providing an envelope detection circuit 42 formed with a detecting diode 40 and a smoothing capacitor 41 between the capacitor 27 and the integration circuit 32 in the amplitude control circuit 26 shown in FIG. 2. The output of the amplitude control circuit 26a is connected to the integration circuit 35 to obtain an audio signal. In this case also, the image-frequency interference can be prevented. In this embodiment, the automatic gain control circuit 37 is connected to the output of the detection circuit 42 to carry out the automatic gain control.

In the above described embodiments, the harmonic oscillation circuit 16 is made up of an operational amplifier; however, it goes without saying that it can be otherwise made up of transistors, vacuum tubes, or the like. In addition, the low-pass filter 35 is an R-C filter in the above-described embodiments; however, it may be obtained by combining a coil and a capacitor, or it may be variously modified; that is, it may be of the $\pi$ type or T type instead of the L type. Moreover, the arrangements of the amplitude control circuits 26 and 26A are not limited to those shown in FIGS. 2 and 4. For instance, the field effect transistors 29 may be replaced by a bipolar transistor, and the filter 32 may be of the $\pi$ type or T type.

As is apparent from the above description, according to the invention, the harmonic oscillation circuit for outputting the signal synchronous with the input amplitude-modulated signal is provided so that the output of the harmonic oscillation circuit is utilized for AM demodulation. Accordingly, unlike the conventional superheterodyne system, in this invention the image-frequency components are not detected, that is, the tuned frequency component only is detected, and therefore no image-frequency interference occurs and the occurrence of radio interference can be prevented. The radio interference can be more effectively prevented by providing the synchronization detection circuit which operates to synchronously detect the amplitude-modulated signal with the aid of the output signal of the harmonic oscillation circuit. Furthermore, the synchronization detection can be carried out more readily and the erroneous operation of the synchronization detection circuit can be prevented more effectively by the provision of the amplitude control circuit adapted to maintain the output signal of the harmonic oscillation circuit constant. In addition, the provision of the AM demodulation means in which the demodulated signal is obtained from the amplitude control circuit contributes to simplification of the circuitry and to reduction of the manufacturing cost.

Unlike the conventional AM receiver, the AM receiver according to this invention has no process that the frequency of a received signal is converted into a certain frequency (or an intermediate frequency) to amplify the received signal, and accordingly it is unnecessary to provide an expensive intermediate-frequency filter to improve the selectivity. In addition, the detection (demodulation) band width can be set as desired by means of the low-pass filter provided in the stage next to the AM demodulation means (the synchronization detection circuit or the amplitude control circuit), and therefore a frequency response conforming to signal receiving conditions for purposes of the signal reception can be readily obtained. Furthermore, the tuned frequency can be immediately read by designing the circuitry so as to supply the output signal of the harmonic oscillation circuit to the frequency counter, which is considerably convenient in operating the AM receiver.

What is claimed is:

1. An AM radio receiver comprising:
   (a) an antenna;
   (b) a tuning circuit receiving an amplitude-modulated radio wave signal through the antenna for producing a high-frequency signal of a tuned frequency;
   (c) harmonic oscillation means receiving said high-frequency signal for producing an output signal which is equal in frequency and synchronous in phase with respect to said high-frequency signal; and
   (d) demodulation means for demodulating said amplitude-modulated signal by the use of the output signal of said harmonic oscillation means, said tuning circuit and said harmonic oscillation means comprising tuning-frequency varying means and oscillation-frequency varying means, respectively, both said frequency-varying means being interlocked with each other.

2. An AM receiver as claimed in claim 1, in which said demodulation means comprises synchronization detection means for synchronously detecting said amplitude-modulated signal with the aid of the output signal of said harmonic oscillation means.

3. An AM receiver as claimed in claim 1, further comprising amplitude control means for maintaining the amplitude of the output signal of said harmonic oscillation means constant.

4. An AM receiver as claimed in claim 3, in which said demodulation means is an envelope detector connected in series in said amplitude control means, said amplitude control means being connected to apply the output of said harmonic oscillation means to the input thereof.

5. An AM receiver as claimed in claim 1, which further comprises frequency counter means responsive to the output of said harmonic oscillation means for indicating a received signal frequency.

6. An AM radio receiver comprising:
(a) an antenna;
(b) a tuning circuit receiving an amplitude-modulated radio wave signal through the antenna for producing a high-frequency signal of a tuned frequency;
(c) harmonic oscillation means receiving said high-frequency signal for producing an output signal which is equal in frequency and synchronous in phase with respect to said high-frequency signal;
(d) demodulation means for demodulating said amplitude-modulated signal by the use of the output signal of said harmonic oscillation means; and
(e) amplitude control means for maintaining the amplitude of the output signal of said harmonic oscillation means constant;

said demodulation means comprising an envelope detector connected in series in said amplitude control means, said amplitude control means being connected to apply the output signal of said harmonic oscillation means to the input thereof.

* * * * *